(12) United States Patent
Suyama et al.

(10) Patent No.: US 7,251,021 B2
(45) Date of Patent: Jul. 31, 2007

(54) SUBSTRATE TRANSFER APPARATUS

(75) Inventors: Toshiaki Suyama, Nagano (JP);
Makoto Kawahara, Nagano (JP);
Masaru Yamazaki, Nagano (JP);
Takahiro Rokugawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/535,284

(22) Filed: Sep. 26, 2006

(65) Prior Publication Data

US 2007/0070325 A1 Mar. 29, 2007

(30) Foreign Application Priority Data

Sep. 28, 2005 (JP) ............................. 2005-282141

(51) Int. Cl.
*G03B 27/58* (2006.01)
*G03B 27/62* (2006.01)
*B65G 21/677* (2006.01)

(52) U.S. Cl. ........................... 355/72; 355/75; 414/217

(58) Field of Classification Search ................. 355/53, 355/72–76; 198/346, 817; 414/391, 809, 414/217

See application file for complete search history.

(56) References Cited

U.S. PATENT DOCUMENTS

| 5,921,377 | A  | * | 7/1999  | Tan et al. ............... 198/817 |
| 6,272,737 | B1 | * | 8/2001  | Asai et al. ............... 29/740 |
| 6,460,690 | B1 | * | 10/2002 | Tachibana et al. ........ 198/791 |
| 7,036,658 | B2 | * | 5/2006  | Hartness et al. ....... 198/803.7 |

FOREIGN PATENT DOCUMENTS

JP  2005-508816  4/2005

\* cited by examiner

*Primary Examiner*—Henry Hung Nguyen
(74) *Attorney, Agent, or Firm*—Rankin, Hill, Porter & Clark LLP

(57) ABSTRACT

A substrate transfer apparatus has pluralities of pairs of substrate support mechanisms. The substrate support mechanism includes a first roller provided on a first rotary shaft and a second roller provided on a second rotary shaft, the substrate support mechanism transfers a substrate in a transfer direction while supporting the substrate between the first and second rollers in a thickness direction of the substrate. The pair of the substrate support mechanisms are disposed so as to oppose to each other in a width direction of the substrate and the pairs of the substrate support mechanisms are arranged along with the transfer direction. Further, a substrate position regulating member that regulates a position of the substrate by contacting with a side surface which is parallel to the transfer direction is provided on either of the first and second rotary shafts.

8 Claims, 10 Drawing Sheets

SUBSTRATE TRANSFER APPARATUS

TECHNICAL FIELD

The present invention relates to a substrate transfer apparatus, and particularly to a substrate transfer apparatus which transfers a variety of substrates, such as a semiconductor wafer, a glass substrate and printed circuit board, while supporting both surfaces of the substrates.

BACKGROUND ART

In a case where a product is manufactured by forming a pattern on a front surface or each surface of a substrate such as a semiconductor wafer, a glass substrate or a printed circuit board, a substrate transfer apparatus transferring the substrate is employed. The substrate transfer apparatus is used in, for example, a plating process, an etching process, a cleaning process or the like.

Also, some substrate transfer apparatuses transfer a substrate while supporting both surfaces of the substrate. Such a substrate transfer apparatus is applied to a cleaning apparatus, which sprays the substrate with a process liquid ejected from a spray nozzle, an etching apparatus and the like (refer to FIGS. 1 and 2).

FIG. 1 is a plan view of a substrate transfer apparatus, and FIG. 2 is a view of the substrate transfer apparatus seen in the direction of A shown in FIG. 1. In FIG. 1, B depicts a transfer direction of a substrate 102 (hereafter referred to as a "transfer direction B"). Also, in FIG. 2, D1 and D2 depict clamping regions required for transferring the substrate 102 (hereafter referred to as "clamping regions D1 and D2"), and E a region in which a pattern can be formed (hereafter referred to as a "pattern forming region E"). The clamping regions D1 and D2 refer to regions for the substrate transfer apparatus 100 to support the substrate 102, and no pattern can be formed in the regions.

Referring to FIGS. 1 and 2, the substrate transfer apparatus 100 has a first substrate support transfer member 105-1 and second substrate support transfer member 105-2. The first substrate support transfer member 105-1 has a plurality of substrate support mechanisms 101A provided along the transfer direction B of the substrate 102. The second substrate support transfer member 105-2 has a plurality of substrate support mechanisms 101B provided along the transfer direction B of the substrate 102. The first and second substrate support transfer members 105-1 and 105-2 are disposed in such a way that the substrate support mechanisms 101A are opposed to the substrate support mechanisms 101B.

The substrate support mechanisms 101A each have rotary shafts 103 and 106, an upper roller 104, a lower roller 107 and drive means (not shown) which rotates the rotary shafts 103 and 106.

The rotary shaft 103 is disposed in such a way that a direction perpendicular to the transfer direction B of the substrate 102 forms a predetermined angle α with an axial direction of the rotary shaft 103. The upper roller 104, being a roller which makes contact with a front surface of the substrate 102, is provided on the rotary shaft 103. The upper roller 104 is disposed in such a way that a rotation direction of the upper roller 104 is directed outward with respect to the transfer direction B of the substrate 102. A rotation direction of the upper roller 104 forms a predetermined angle α with the transfer direction B of the substrate 102.

The rotary shaft 106 is provided below the rotary shaft 103, and the direction perpendicular to the transfer direction B of the substrate 102 forms a predetermined angle α with an axial direction of the rotary shaft 106.

The lower roller 107 is provided on the rotary shaft 106 in such a way as to oppose the upper roller 104 in a thickness direction of the substrate 102. A rotation direction of the lower roller 107 is directed outward with respect to the transfer direction B of the substrate 102. The rotation direction of the lower roller 107 forms a predetermined angle α with the transfer direction B of the substrate 102. The lower roller 107, being a roller which makes contact with a back surface 102B of the substrate 102, transfers the substrate 102 in conjunction with the upper roller 104. Also, the substrate support mechanisms 101B are configured in the same way as the substrate support mechanisms 101A.

In the thus configured substrate transfer apparatus 100, since the upper roller 104 and the lower roller 107 do not contact with the pattern forming region E of the substrate 102, it is possible to prevent a microscopic pattern formed on the substrate 102 from being damaged by the upper roller 104 and the lower roller 107.

Also, as the rotation direction of the upper roller 104 and the lower roller 107 is directed outward with respect to the transfer direction B of the substrate 102, a tension is generated in a direction directed outwardly of the substrate 102 from the center of the substrate 102, enabling the substrate 102 to be prevented from deflecting (See Japanese Patent Unexamined Publication JP-A-2005-508816).

However, in the above-described substrate transfer apparatus 100, because a tension of the upper and lower rollers 104, 107 provided in the substrate support mechanism 101A and a tension of the upper and lower rollers 104, 107 provided in the substrate support mechanism 101B, the substrate 102 is transferred in a meandering manner. Thus, there are required to increase a width of the clamping regions D1 and D2 in order to prevent the substrate 102 from falling off.

Therefore, there is a problem in that this reduces an area of the pattern forming regions E in which a product is manufactured. In the substrate transfer apparatus 100, in order to transfer the substrate 102 without causing it to fall, the clamping regions D1 and D2 are each required to have a width of 15 mm or more.

When the predetermined angle α is reduced for reducing the clamping regions D1 and D2, the tension is reduced and it leads to a falling of the substrate 102. Accordingly, an employment of ceramics or metal as a material of the upper roller 104 and the lower roller 107 can be considered in order to firmly support the substrate 102. However, in the event that ceramics or metal is used as the material of the upper roller 104 and the lower roller 107, there is a problem in that damage occurs on a surface of the substrate 102 which contacts with the upper roller 104 and the lower roller 107.

Also, the longer a length of the substrate transfer apparatus 100 is, the more significantly the substrate 102 meanders, so that it becomes difficult to adjust the predetermined angle α. Furthermore, as the predetermined angle α is increased, the substrate 102 meanders more significantly, so that the substrate 102 runs off and falls off from the upper roller 104 and the lower roller 107. Also, as the predetermined angle α is reduced, the tension is reduced, therefore a central portion of the substrate 102 deflects, and the substrate 102 runs off and falls off from the upper roller 104 and the lower roller 107.

SUMMARY OF THE INVENTION

Accordingly, bearing in mind the heretofore described problems, the invention has been conceived with an object of providing a substrate transfer apparatus which can accurately transfer a substrate in a condition in which a pattern forming region is widened.

According to an aspect of the invention, there is provided a substrate transfer apparatus comprising
pluralities of pairs of substrate support mechanisms,
the substrate support mechanism comprising:
a first roller provided on a first rotary shaft; and
a second roller provided on a second rotary shaft,
wherein the substrate support mechanism transfers a substrate in a transfer direction while supporting the substrate between the first and second rollers in a thickness direction of the substrate,
wherein the pair of the substrate support mechanisms are disposed so as to oppose to each other in a width direction of the substrate,
the pairs of the substrate support mechanisms are arranged along with the transfer direction, and
a substrate position regulating member that regulates a position of the substrate by contacting with a side surface which is parallel to the transfer direction is provided on either of the first and second rotary shafts.

According to the invention, a position of the substrate is regulated by the substrate position regulating member which makes contact with a side surface of the substrate which is parallel to the transfer direction, on either of the first and second rotary shafts. Thus, it enables the first and second roller to be provided closer to the side surface of the substrate than in the above-described case. By this means, it is possible to accurately transfer the substrate while ensuring the width of a pattern forming region on which a product is manufactured as large.

According to the invention, it is possible to accurately transfer the substrate while ensuring large width of the pattern forming region.

DETAILED DESCRIPTION OF THE PREFERRED EMBODIMENTS

Next, an embodiment of the invention will be described with reference to the drawings.

Figure 1:
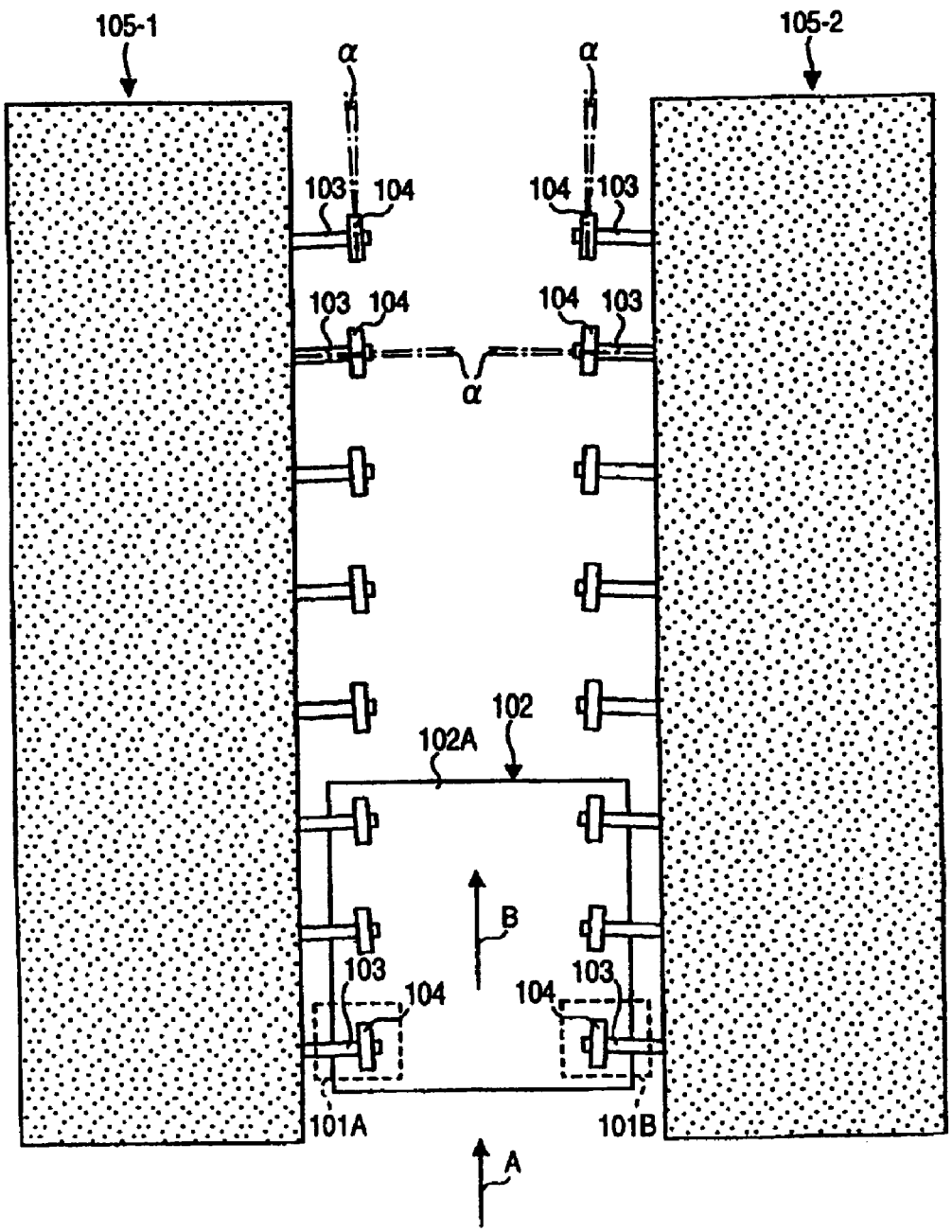
FIG. 1 is a plan view of a substrate transfer apparatus of a related art.
Figure 2:
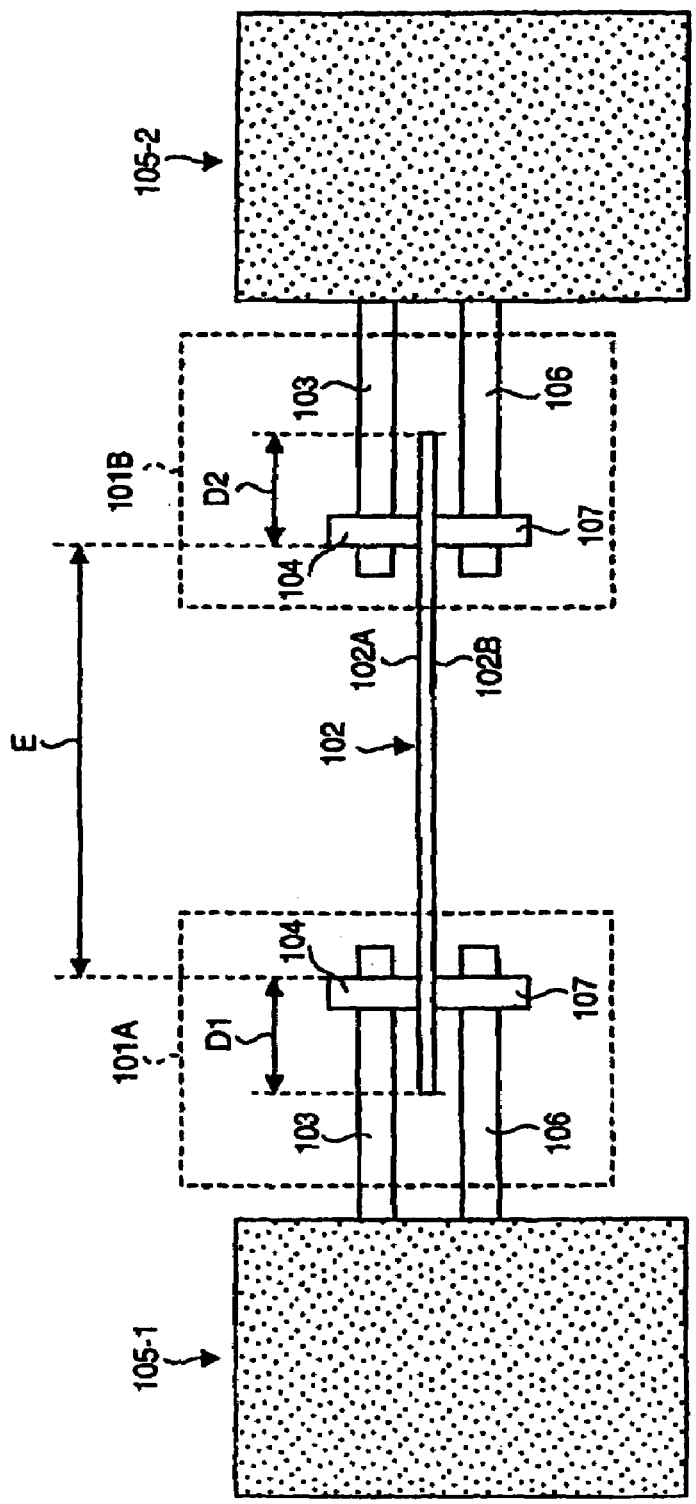
FIG. 2 is a view showing substrate transfer apparatus seen in direction of A shown in FIG. 1
Figure 3:
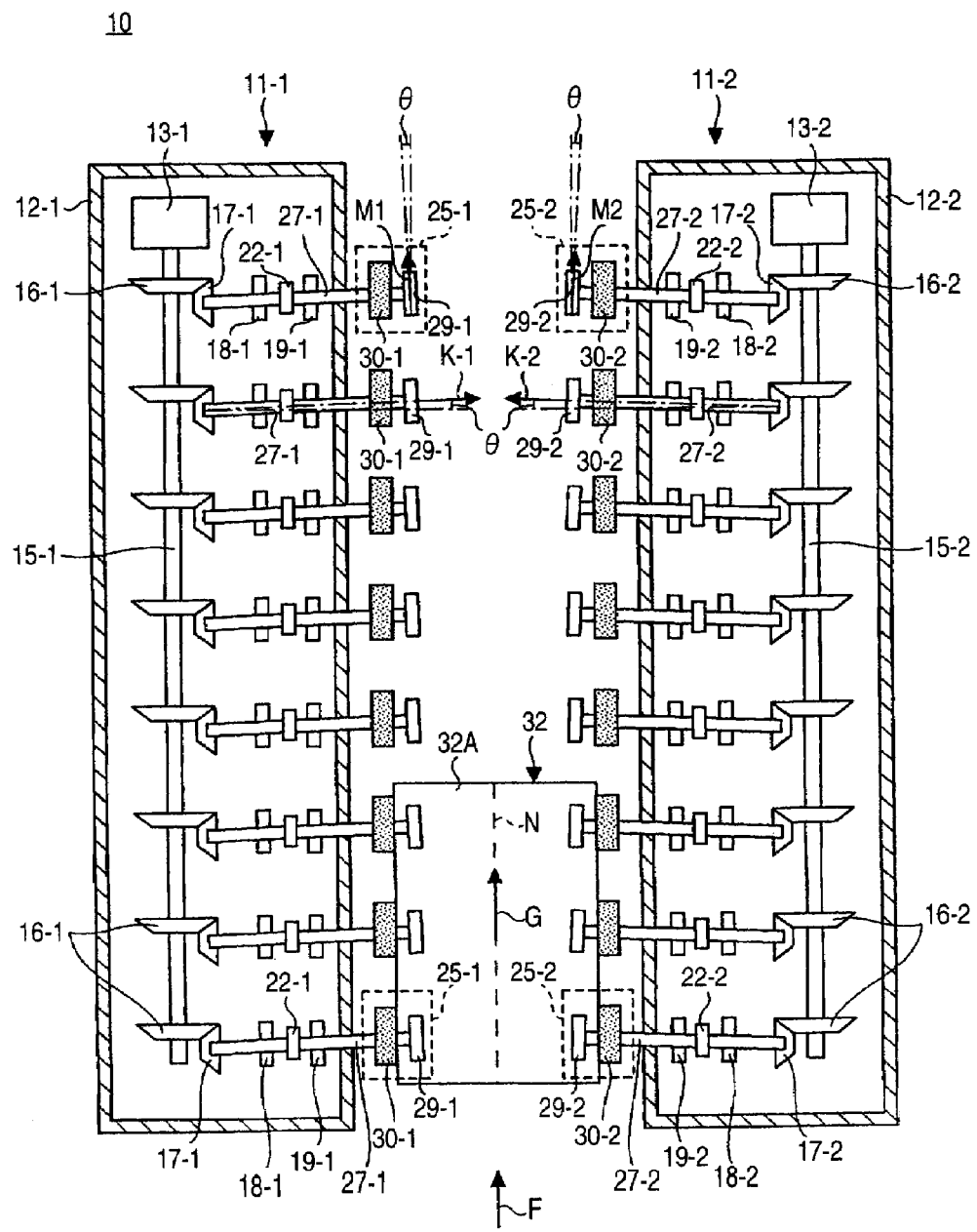
FIG. 3 is a plan view of substrate transfer apparatus according to an embodiment of the invention.
Figure 4:
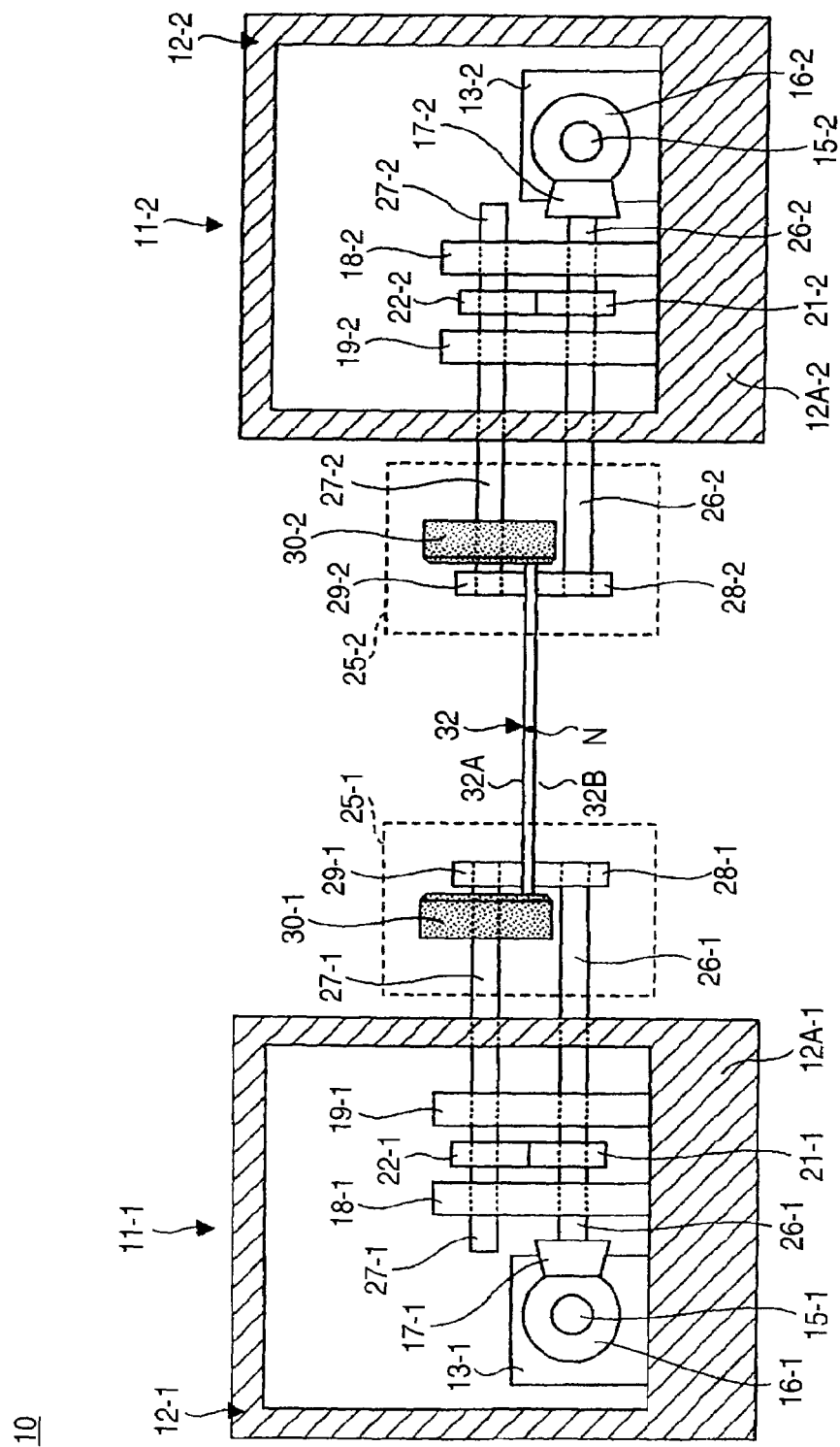
FIG. 4 is a sectional view of substrate transfer apparatus shown in FIG. 3.

FIG. 3 is a plan view of a substrate transfer apparatus according to the embodiment of the invention. FIG. 4 is a sectional view of the substrate transfer apparatus shown in FIG. 3. In FIG. 3, G depicts a transfer direction of a substrate 32 (hereafter referred to as a "transfer direction G"), K-1 an axial direction of a second rotary shaft 27-1 (hereafter referred to as an "axial direction K-1"), and K-2 an axial direction of a second rotary shaft 27-2 (hereafter referred to as an "axial direction K-2"). Also, in FIG. 3, N depicts a center of the substrate 32 (hereafter referred to as a "center N"), M1 a rotation direction of a second roller 29-1 (hereafter referred to as a "rotation direction M1"), and M2 a rotation direction of a second roller 29-2 (hereafter referred to as a "rotation direction M2").

Referring to FIGS. 3 and 4, the substrate transfer apparatus 10 has a first substrate support transfer device 11-1 and a second support transfer device 11-2. The first and second support transfer devices 11-1 and 11-2 are disposed in such a way that a substrate support mechanism 25-1 on the first support transfer device 11-1 is opposed to a substrate support mechanism 25-2 on the second support transfer device 11-2.

The first and second substrate support transfer device 11-1 and 11-2 are made to have substantially the same configuration. Consequently, in FIGS. 3 and 4, a suffix -1 being affixed to reference characters of components of the first substrate support transfer device 11-1 disposed on a left in the figures. In the same manner, a suffix -2 being affixed to reference characters of components of the second substrate support transfer device 11-2 disposed on a right. A description will be given of mainly the first substrate support transfer device 11-1.

The first substrate support transfer device 11-1 has a housing 12-1, a drive device 13-1, a drive shaft 15-1, bevel gears 16-1 and 17-1, bearing traverses 18-1, 19-1, a lower gear 21-1, an upper gear 22-1, and a plurality of substrate support mechanisms 25-1.

The housing 12-1 contains the drive device 13-1, the drive shaft 15-1, the bevel gears 16-1 and 17-1, the lower gear 21-1, the upper gear 22-1, the bearing traverses 18-1, 19-1, and a first and the second rotary shaft 26-1, 27-1 to be described hereafter.

The drive device 13-1, being provided on a bottom 12A-1 of the housing 12-1, is connected to the drive shaft 15-1. The drive device 13-1 is for rotating the drive shaft 15-1. The drive shaft 15-1 is provided inside the housing 12-1 in such a way as to extend in the transfer direction G of the substrate 32 and is connected to the drive device 13-1.

A plurality of the bevel gears 16-1 are provided on the drive shaft 15-1 with a predetermined pitch. The bevel gear 16-1 is connected to the bevel gear 17-1 provided on the first rotary shaft 26-1. The bevel gear 16-1 rotates with the drive shaft 15-1 for transmitting a rotational movement of the drive shaft 15-1 to the bevel gear 17-1 when the drive shaft 15-1 rotates.

The bevel gear 17-1 is provided at an end of the first rotary shaft 26-1 positioned on the drive shaft 15-1 side and is connected to the bevel gear 16-1. The bevel gear 17-1 rotates the first rotary shaft 26-1 by means of the rotational movement transmitted from the bevel gear 16-1.

The bearing traverse 18-1 is provided on a bottom 12A-1 of the housing 12-1 which is positioned between the bevel gear 17-1 and the lower gear 21-1. The bearing traverse 19-1 is provided on a bottom 12A-1 of the housing 12-1 which is positioned at a right of the lower gear 21-1 (refer to FIG. 4).

The bearing traverses 18-1, 19-1 have slits (not shown) through which the first and second rotary shafts 26-1, 27-1 pass. The bearing traverses 18-1, 19-1 are for adjusting positions of the first and second rotary shafts 26-1, 27-1 in such a way that an angle, formed by an axial direction of each of the first and second rotary shafts 26-1, 27-1 and a direction perpendicular to the transfer direction G of the substrate 32, is a predetermined angle θ. The adjustment is carried out by displacing the bearing traverses 18-1, 19-1 with respect to the transfer direction G of the substrate 32.

The lower gear 21-1 is provided on a portion of the first rotary shaft 26-1 positioned between the bearing traverses 18-1, 19-1. The lower gear 21-1 is connected to the upper gear 22-1. When the first rotary shaft 26-1 is rotated, the lower gear 21-1 rotates the upper gear 22-1 by rotating with the first rotary shaft 26-1.

The upper gear 22-1 is provided on the second rotary shaft 27-1 in such a way as to oppose the lower gear 21-1. The upper gear 22-1 is connected to the lower gear 21-1 and rotates the second rotary shaft 27-1 by means of the rotational movement transmitted from the lower gear 21-1.

Figure 5:
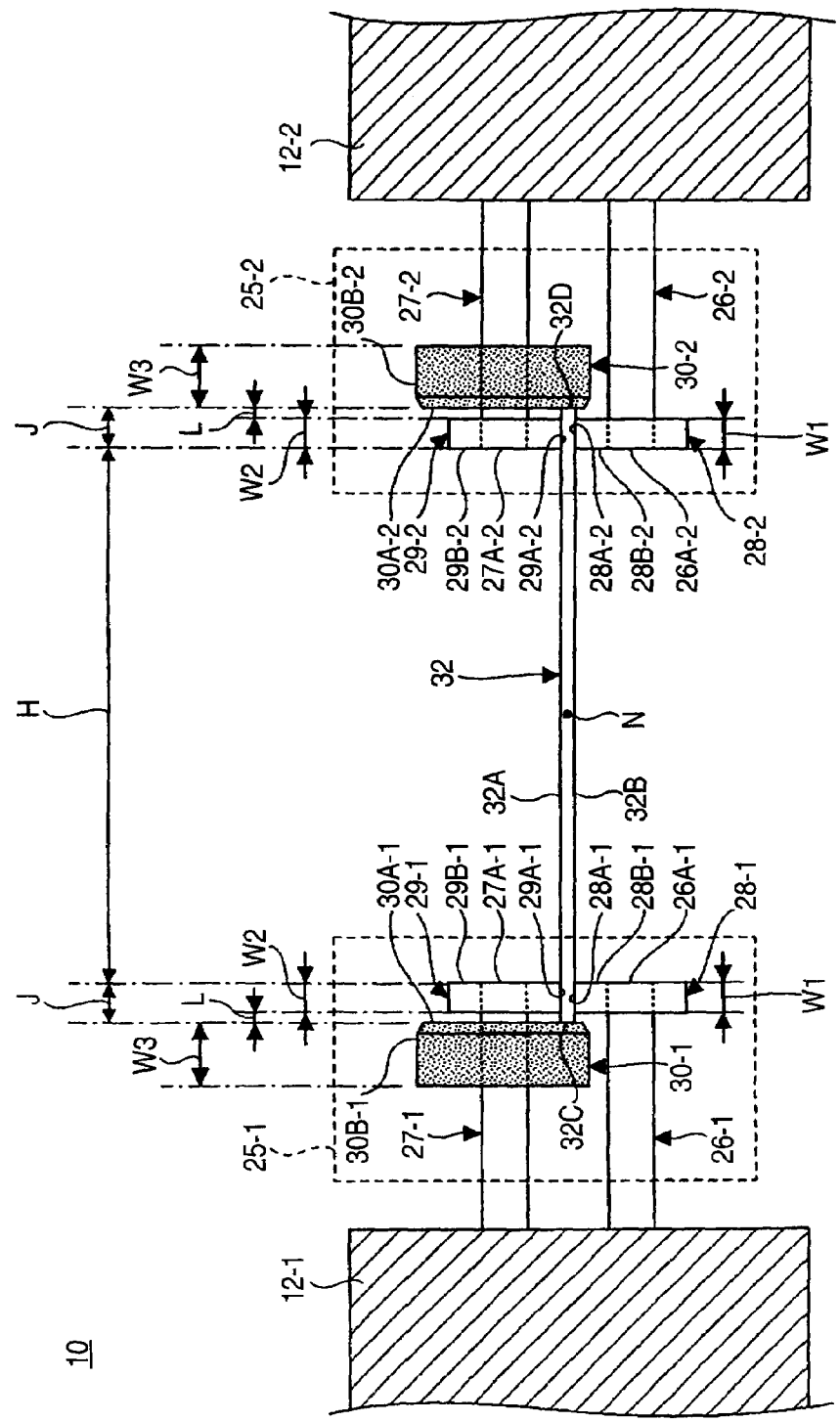
FIG. 5 is a view of substrate transfer apparatus seen in direction of F shown in FIG. 3.

FIG. 5 is a view of the substrate transfer apparatus seen in the direction of F shown in FIG. 3. In FIG. 5, H depicts a region of the substrate 32 in which a pattern can be formed (a product can be formed) (hereafter referred to as a "pattern forming region H"), and J a region required for supporting the substrate 32 in such a way as to be able to transfer the substrate 32 (hereafter referred to as a "clamping region J")

Next, the substrate support mechanism 25-1 will be described with reference to FIGS. 3 to 5. The substrate support mechanism 25-1 is provided in a portion of the first and second rotary shafts 26-1, 27-1 which projects from the housing 12-1. A plurality of the support mechanisms 25-1, being provided along with the transfer direction G of the substrate 32, is disposed opposite the support mechanisms 25-2 provided on the substrate support transfer device 11-2. In other words, the support mechanisms 25-1 is disposed so as to oppose to the support mechanisms 25-2 in a width direction of the substrate 32.

The substrate support mechanism 25-1 has the first rotary shaft 26-1, the second rotary shaft 27-1, a first roller 28-1, a second roller 29-1, and a position regulating roller 30-1 which is the substrate position regulating member.

The first rotary shaft 26-1 passes through the slits (not shown) of the bearing traverses 18-1, 19-1 while projecting from the housing 12-1. The end of the first rotary shaft 26-1, which is positioned on the drive shaft 15-1 side, is connected to the bevel gear 17-1. The first rotary shaft 26-1 is disposed in such a way that an angle defined between the axial direction of the first rotary shaft 26-1 and the direction perpendicular to the transfer direction G of the substrate 32 is set as the predetermined angle θ (refer to FIG. 3). The predetermined angle θ is formed on a side of the substrate 32 in the transfer direction G. The predetermined angle θ can be selected as appropriate within a range of 0.5° to 5°. For example, even in the event that a tension is increased by setting the predetermined angle θ to be larger than 2°, as the substrate 32 is regulated by the position regulating rollers 30-1 and 30-2, the substrate 32 is prevented from meandering. By this means, as well as it becoming possible to increase an adjustment range of the predetermined angle θ, it is possible to easily adjust the predetermined angle θ.

When the bevel gear 17-1 rotates, the first rotary shaft 26-1 rotates the first roller 28-1 by rotating with the bevel gear 17-1.

The second rotary shaft 27-1 is provided above the first rotary shaft 26-1 in such a way as to pass through the slits (not shown) of the bearing traverses 18-1, 19-1 while projecting from the housing 12-1. The second rotary shaft 27-1 is disposed in such a way that the axial direction K-1 of the second rotary shaft 27-1 and the direction perpendicular to the transfer direction G of the substrate 32 form the predetermined angle θ. The predetermined angle θ, being formed on a side of the substrate 32 in the transfer direction G, is substantially equal to the predetermined angle θ described in the first rotary shaft 26-1.

The first roller 28-1 is provided on the first rotary shaft 26-1 in a condition in which a rotation direction of the first roller 28-1 is directed outward with respect to the transfer direction G of the substrate 32. A predetermined angle θ is formed between the rotation direction of the first roller 28-1 and the transfer direction G of the substrate 32. The predetermined angle θ is substantially equal to the predetermined angle θ described in the first rotary shaft 26-1.

In this way, by directing the rotation direction of the first roller 28-1 outward with respect to the transfer direction G of the substrate 32 while rotating the first roller 28-1, a tension is generated outwardly of the transfer direction G of the substrate 32. Thus, it enables to transfer the substrate 32 without being deflected.

Figure 6:
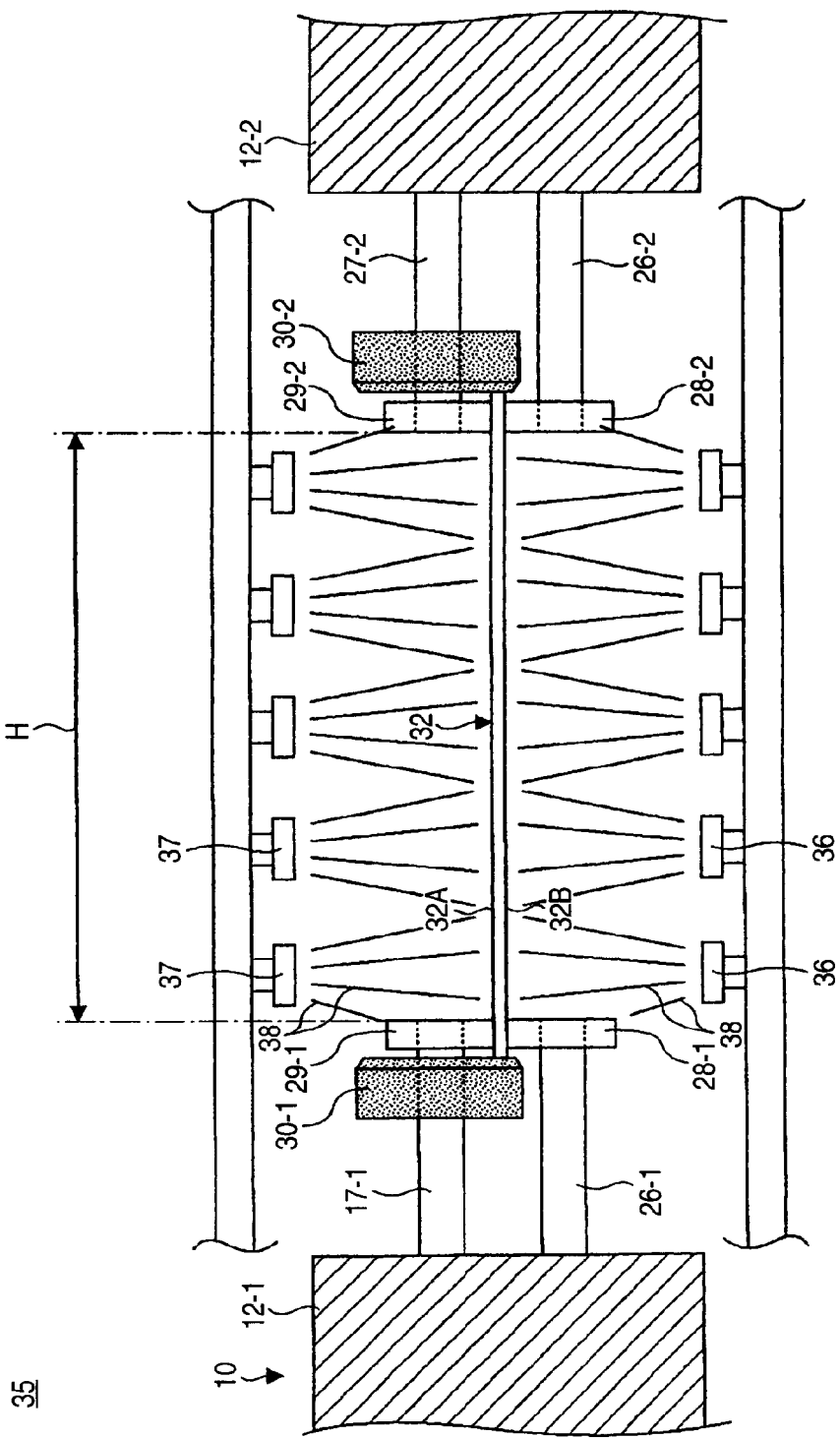
FIG. 6 is a section view of cleaning apparatus equipped with substrate transfer apparatus of the embodiment.

FIG. 6 is a sectional view of a cleaning apparatus equipped with the substrate transfer apparatus of the embodiment. In FIG. 6, the same components as those of the substrate transfer apparatus 10 shown in FIG. 5 are identified by similar reference characters.

Also, a surface 28B-1 of the first roller 28-1, which is positioned on the center N side of the substrate 32, is set to be substantially flush with an end face 26A-1 of the first rotary shaft 26-1 (refer to FIG. 5).

In this way, the side surface 28B-1 of the first roller 28-1, which is positioned on the center N side of the substrate 32 (that is, substrate 32 side), are set to be substantially flush with the end face 26A-1 of the first rotary shaft 26-1. For example, as shown in FIG. 6, in a case where the substrate transfer apparatus 10 is applied to the cleaning apparatus 35 equipped with spray nozzles 36 and 37, it becomes possible to carry out a cleaning by supplying a cleaning liquid 38 evenly to a back surface 32B of the substrate 32 which corresponds to the pattern forming region H, thus making it possible to improve a yield of a product manufactured on the substrate 32.

The first roller 28-1 has a contact surface 28A-1 which makes contact with the back surface 32B of the substrate 32. By rotating integrally with the first rotary shaft 26-1, the first roller 28-1 transfers the substrate 32 in the transfer direction G in conjunction with the second roller 29-1.

In a case where a width of the clamping region J is set 7 mm, which is smaller than a width of 15 mm of the related art, a width W1 of the first roller 28-1 can be set at, for example, 5 mm. Also, the first roller 28-1 can employ as its material, for example, rubber of high abrasion resistance. By employing rubber as the material of the first roller 28-1, it is possible to prevent the substrate 32 from being damaged by the first roller 28-1.

The second roller 29-1 is provided on the second rotary shaft 27-1 in a condition in which the rotation direction M1 of the second roller 29-1 is directed outward with respect to the transfer direction G of the substrate 32. A predetermined angle θ is formed between the rotation direction M1 of the second roller 29-1 and the transfer direction G of the substrate 32. The predetermined angle θ is substantially equal to the predetermined angle θ described in the first rotary shaft 26-1.

In this way, by directing the rotation direction of the second roller 29-1 outward with respect to the transfer direction G of the substrate 32 while rotating the second roller 29-1, a tension is generated outwardly of the transfer direction G of the substrate 32. Thus, it enables to transfer the substrate 32 without being deflected.

Also, a surface 29B-1 of the second roller 29-1, which is positioned on the center N side of the substrate 32, is set to be substantially flush with an end face 27A-1 of the second rotary shaft 27-1.

In this way, the surface 29B-1 of the second roller 29-1, which is positioned on the center N side of the substrate 32, is set to be substantially flush with the end face 27A-1 of the second rotary shaft 27-1. For example, in the case where the substrate transfer apparatus 10 is applied to the cleaning apparatus 35 equipped with the spray nozzles 36 and 37 (refer to FIG. 6), it becomes possible to carry out a cleaning by supplying the cleaning liquid 38 evenly to a front surface 32A of the substrate 32 which corresponds to the pattern forming region H. Thus, it makes possible to improve a yield of a product manufactured on the substrate 32.

The second roller 29-1 has a contact surface 29A-1 which makes contact with the front surface 32A of the substrate 32. By rotating integrally with the second rotary shaft 27-1, the second roller 29-1 transfers the substrate 32 in the transfer direction G in conjunction with the first roller 28-1.

In the case where the width of the clamping region J is set 7 mm, a width W2 of the second roller 29-1 can be set at, for example, 5 mm. The second roller 29-1 can employ as its material, for example, rubber of high abrasion resistance. By employing rubber as the material of the second roller 29-1, it is possible to prevent the substrate 32 from being damaged by the second roller 29-1.

The position regulating roller 30-1 is provided on the second rotary shaft 27-1 on a side of the second roller 29-1 opposite the center N of the substrate 32. The position regulating roller 30-1 is for regulating a position of the substrate 32 by making contact with a side surface 32C of the substrate 32 which is parallel to the transfer direction G of the substrate 32. A configuration is such that the position regulating roller 30-1 has a larger diameter than the second roller 29-1.

In this way, by making the position regulating roller 30-1 larger in diameter than the second roller 29-1, a surface 30A-1 of the position regulating roller 30-1, which faces the substrate 32, is brought into contact with the side surface 32C of the substrate 32. Also, a position of the substrate 32 in the direction perpendicular to the transfer direction G is regulated, thereby making it possible to accurately transfer the substrate 32.

Also, by the position of the substrate 32 being regulated by the position regulating roller 30-1, the first and second roller 28-1 and 29-1 are disposed closer to the side surface 32C side of the substrate 32 than in the related art. Thus, it becomes possible to reduce the width of the clamping region J and increase an area of the pattern forming region H on the substrate 32. As this increases a number of products obtained per substrate, it is possible to reduce a cost of manufacturing products. The width of the clamping region J can be set at, for example, 7 mm, which is smaller than the width of 15 mm of the related art.

Also, the position regulating roller 30-1 is configured in such a way as to rotate integrally with the second rotary shaft 27-1. In this way, the rotation of the position regulating roller 30-1 reduces a load applied to the side surface 32C of the substrate 32 which makes contact with the position regulating roller 30-1, thereby making it possible to prevent the substrate 32 from being damaged.

Furthermore, an edge 30B-1 of the position regulating roller 30-1, which faces the second roller 29-1, is chamfered.

In this way, by chamfering the edge 30B-1 of the position regulating roller 30-1 on a side thereof with which the side surface 32C of the substrate 32 makes contact, it is possible to prevent the substrate 32 from being damaged.

In the case where the width of the clamping region J is set at 7 mm, a distance L between the second roller 29-1 and the position regulating roller 30-1 can be set at, for example, 2 mm. Also, the position regulating roller 30-1 can employ stainless steel, ceramics or the like as its material. A width W3 of the position regulating roller 30-1 can be set at, for example, 10 mm.

The second substrate support transfer device 11-2 is configured in the same way as the heretofore described first substrate support transfer device 11-1. The second substrate support transfer device 11-2 has a plurality of the substrate support mechanisms 25-2 disposed opposite the substrate support mechanisms 25-1. The position regulating roller 30-2 provided on the substrate support mechanism 25-2, which is in contact with an side surface 32D (an opposite side surface to the side surface 32C) of the substrate 32 which is parallel to the transfer direction G, regulates a position of the side surface 32D of the substrate 32.

In this way, by the position of the substrate 32 being regulated by the position regulating roller 30-2, the first and second rollers 28-2 and 29-2 are disposed closer to the side surface 32D of the substrate 32 than in the related art. Thus, it makes possible to reduce the width of the clamping region J and increase the area of the pattern forming region H on the substrate 32.

The position regulating roller 30-2 is configured in the same way as the position regulating roller 30-1, and an edge 30B-2 of the position regulating roller 30-2 on a side thereof which makes contact with the side surface 32D of the substrate 32 is chamfered.

According to the substrate transfer apparatus of the embodiment, by providing any one of the first and second rotary shafts 26-1, 26-2, 27-1 and 27-2 with the position regulating rollers 30-1 and 30-2 which make contact with the side surfaces 32C, 32D of the substrate 32 which is parallel to the transfer direction G, a position of the substrate 32 in the direction perpendicular to the transfer direction G is regulated. As this, as well as enabling the first and second roller 28-1 and 29-1 to be disposed closer to the side surface 32C side of the substrate 32 than in the related art, enables the first and second rollers 28-2 and 29-2 to be disposed closer to the side surface 32D side of the substrate 32 than in the related art, it is possible to accurately transfer the substrate 32 in a condition in which the pattern forming region H in which a product is manufactured is widened.

Also, by chamfering the edges 30B-1 and 30B-2 of the position regulating rollers 30-1 and 30-2 which make contact with the end faces 32C, 32D of the substrate 32, it is possible to prevent the substrate 32 from being damaged.

Furthermore, by directing the rotation direction of the first and second rollers 28-1, 28-2, 29-1 and 29-2 outward with respect to the transfer direction G, it is possible that, when the first and second rollers 28-1, 28-2, 29-1 and 29-2 rotate, a tension is generated outwardly of the transfer direction G of the substrate 32, thereby transferring the substrate 32 without deflecting it.

The embodiment can also be applied to a substrate transfer apparatus configured in such a way that the axial direction of the first and second rotary shafts 26-1, 26-2, 27-1 and 27-2 is perpendicular to the transfer direction G of the substrate 32, and that the rotation direction of the first and second rollers 26-1, 26-2, 27-1 and 27-2 is perpendicular to the axial direction of the first and second rotary shafts 26-1, 26-2, 27-1 and 27-2. Also, it is acceptable that the first and second rollers 28-1, 28-2, 29-1 and 29-2 are integrated with the position regulating rollers 30-1 and 30-2.

A transfer performance of the substrate transfer apparatus 10 of the embodiment is evaluated using the previously described cleaning apparatus 35 (refer to FIG. 6). Specifically, a confirmation is carried out as to whether or not the substrate 32 is stably transferred without being deflected when a pressure of the cleaning liquid 38 ejected from the spray nozzles 36 and 37 is set at 0.20 MPa or 0.27 MPa, and the predetermined angle θ is set at 2°. Also, a plurality of substrates having different thicknesses is prepared as the substrate 32, and their thicknesses are set at 0.4 mm, 0.8 to 1.0 mm and 2.0 mm.

It can be confirmed, from a result of the evaluation, that the substrate 32 can be accurately transferred without depending on the thickness of the substrate 32 or the pressure of the cleaning liquid 38.

Figure 7:
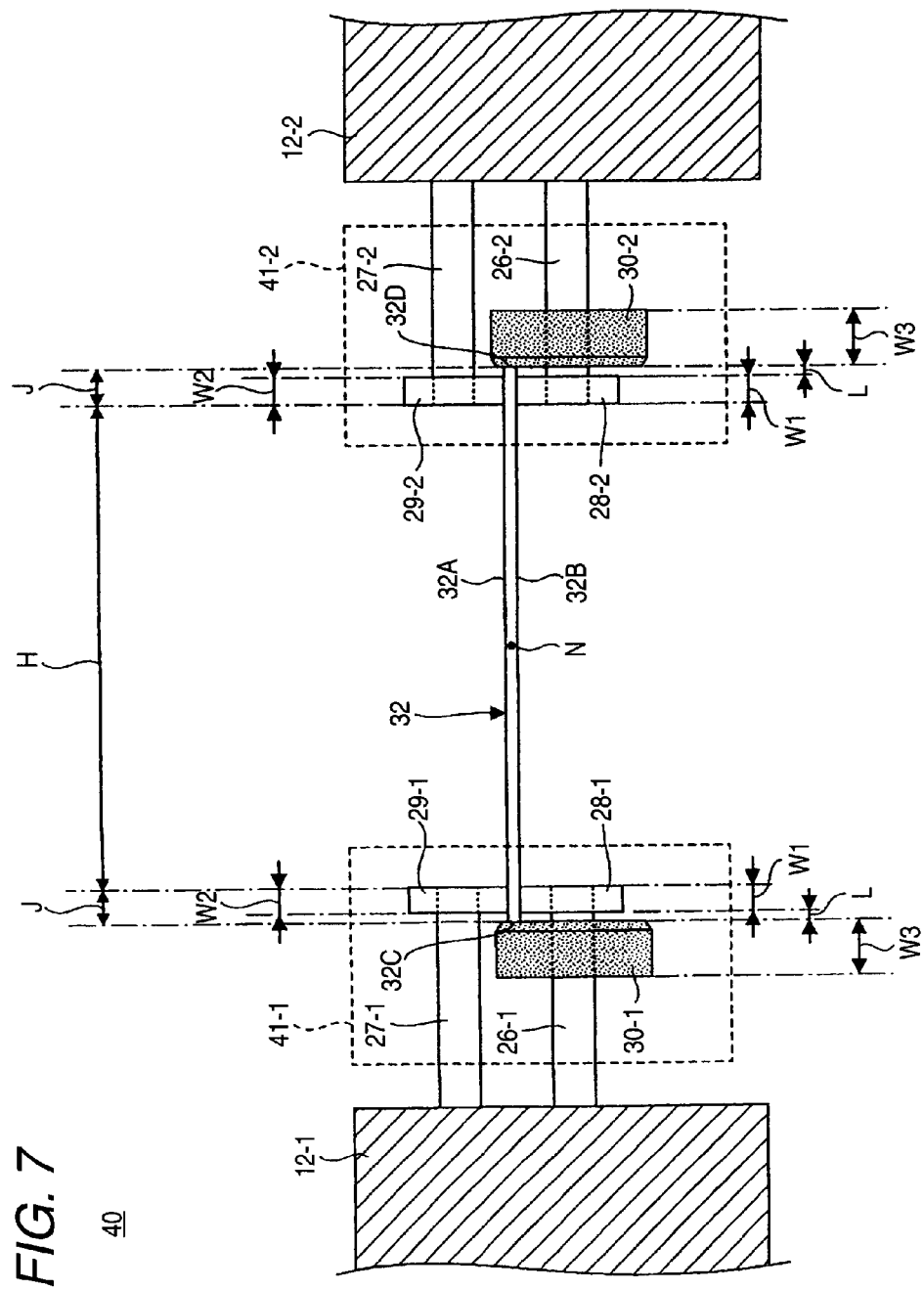
FIG. 7 is a view showing substrate transfer apparatus according to a first modified example of the embodiment.

FIG. 7 is a view showing a substrate transfer apparatus according to a first modified example of the embodiment. In FIG. 7, the same components as those of the substrate transfer apparatus 10 of the embodiment are identified by similar reference characters.

Referring to FIG. 7, the substrate transfer apparatus 40 is configured in the same way as the substrate transfer apparatus 10 except that it is provided with substrate support mechanisms 41-1 and 41-2 in place of the substrate support mechanisms 25-1 and 25-2 provided on the substrate transfer apparatus 10.

The substrate support mechanism 41-1 is configured in the same way as the substrate support mechanism 25-1 except that a position regulating roller 30-1 is provided on a first rotary shaft 26-1. Also, the substrate support mechanism 41-2 is configured in the same way as the substrate support mechanism 25-2 except that a position regulating roller 30-2 is provided on a first shaft 26-2.

In this way, in the substrate transfer apparatus 40 having the position regulating rollers 30-1 and 30-2 provided on the first rotary shafts 26-1 and 26-2 too, it is possible to obtain the same advantageous effect as that of the substrate transfer apparatus 10 of the embodiment.

Figure 8:
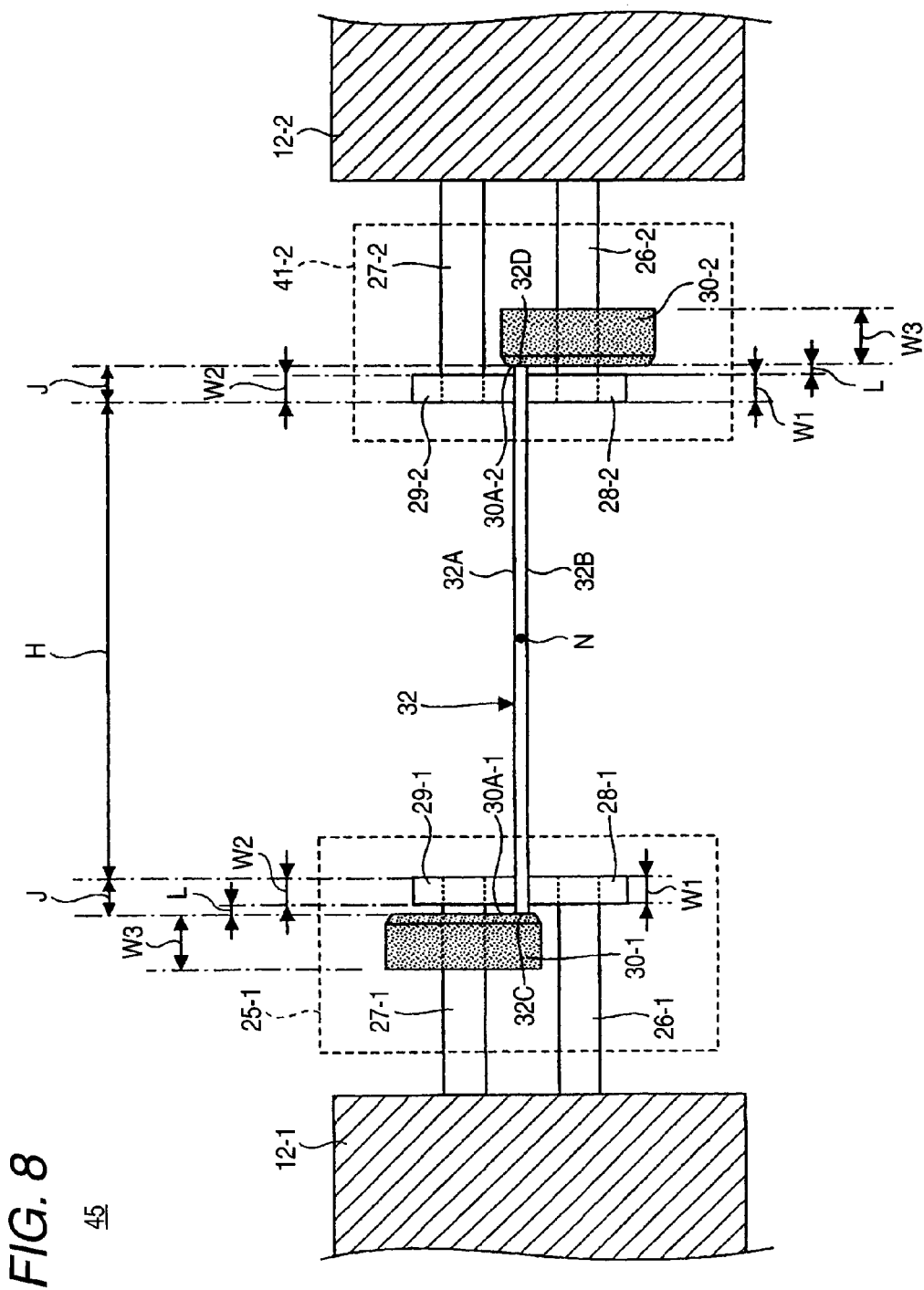
FIG. 8 is a view showing substrate transfer apparatus according to a second modified example of the embodiment.

FIG. 8 is a view showing a substrate transfer apparatus according to a second modified example of the embodiment. In FIG. 8, the same components as those of the substrate transfer apparatus 10 of the embodiment are identified by similar reference characters.

Referring to FIG. 8, the substrate transfer apparatus 45 is configured in the same way as the substrate transfer apparatus 10 except that it is provided with a substrate support mechanism 41-2 in place of the substrate support mechanism 25-2 provided on the substrate transfer apparatus 10.

In this way, also in the substrate transfer apparatus 45 configured in such a way that a position regulating roller 30-1 is provided on a second rotary shaft 27-1, and that a position regulating roller 30-2 is provided on a first rotary shaft 26-2, it is possible to obtain the same effect as that of the substrate transfer apparatus 10 of the embodiment.

Also, it is sufficient that the position regulating rollers 30-1 and 30-2 are disposed in such a way that a surface 30A-1 of the roller 30-1 in a region thereof which makes contact with the side surface 32C of the substrate 32 faces a surface 30A-2 of the roller 30-2 in a region thereof which makes contact with the side surface 32D of the substrate 32. As long as the conditions are satisfied, it is acceptable to provide the position regulating roller 30-1 on either of the first and second rotary shafts 26-1 and 26-2 It is also acceptable to provide the position regulating roller 30-2 on either of the first and second rollers 26-2 and 27-2.

Figure 9:
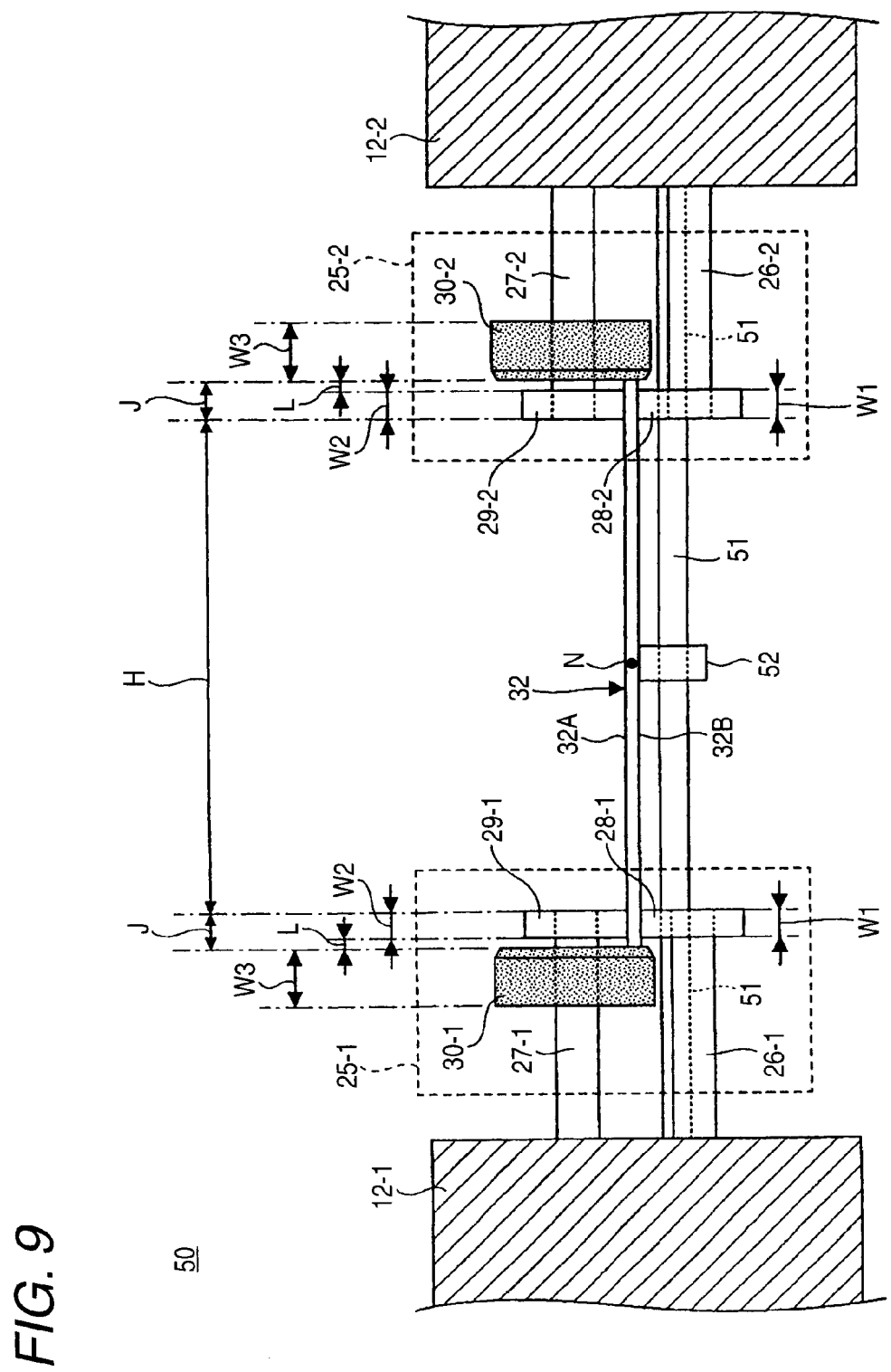
FIG. 9 is a view showing substrate transfer apparatus according to a third modified example of the embodiment.

FIG. 9 is a view showing a substrate transfer apparatus according to a third modified example of the embodiment. In FIG. 9, the same components as those of the substrate transfer apparatus 10 of the embodiment are identified by similar reference characters.

Referring to FIG. 9, the substrate transfer apparatus 50 is configured in such a way that a rotary shaft 51 and a support roller 52 are added to the configuration of the substrate transfer apparatus 10. The rotary shaft 51 is provided in such a way as to connect a housing 12-1 and a housing 12-2. The rotary shaft 51 is disposed on the back surface 32B side of the substrate 32. The rotary shaft 51 is rotated by a not-shown drive device.

The support roller 52 is provided on the rotary shaft 51 positioned in the vicinity of the center N of the substrate 32. The support roller 52 is configured in such a way as to rotate integrally with the rotary shaft 51. The support roller 52 is a roller which supports the back surface 32B of the substrate 32.

In this way, by providing the support roller 52 which supports the back surface 32B of the substrate 32, it is possible to suppress a deflection of the substrate 32.

In the substrate transfer apparatus 50 equipped with such a support roller 52 too, it is possible to obtain the same advantageous effect as that of the substrate transfer apparatus 10 of the embodiment. Also, it is preferable that the substrate transfer apparatus 50 is employed In a case where the substrate 32 is large in size, and there is no microscopically shaped pattern (for example, no isolated wiring pattern or the like) on the back surface 32B side of the substrate 32.

It is also acceptable that a plurality of the support rollers 52 is provided on one rotary shaft 51.

Figure 10:
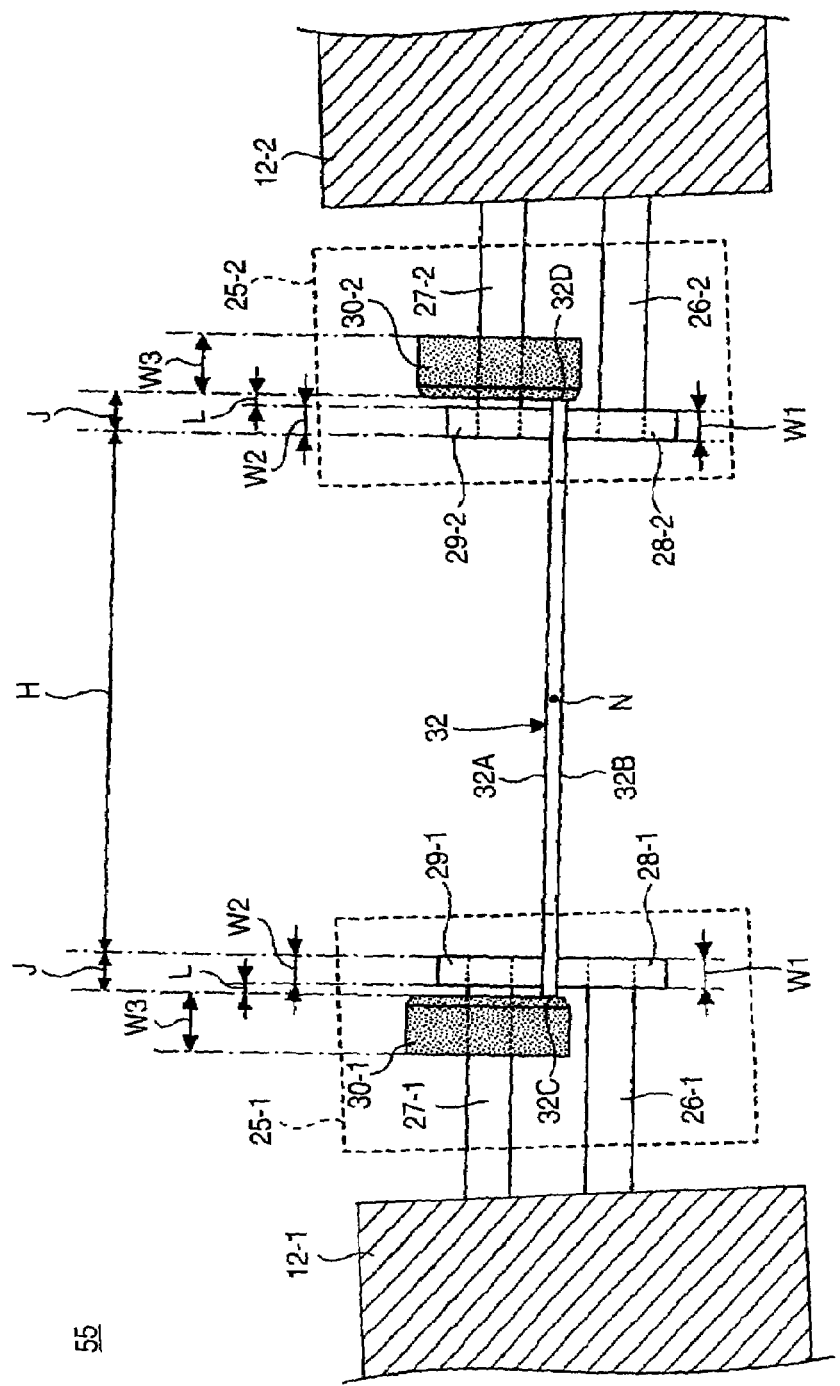
FIG. 10 is a view showing substrate transfer apparatus according to a fourth modified example of the embodiment.

FIG. 10 is a view showing a substrate transfer apparatus according to a fourth modified example of the embodiment.

Referring to FIG. 10, the substrate transfer apparatus 55 is configured in the same way as the substrate transfer apparatus 10 except that substrate support mechanisms 25-1 and 25-2 are configured in such a way as to support the substrate 32 in an inclined state.

In this way, by supporting the substrate 32 in the inclined state, for example, by applying the substrate transfer apparatus 55 to the previously described cleaning apparatus 35 shown in FIG. 6, as the cleaning liquid 38 ejected from the spray nozzles 36 and 37 flows from the side surface 32C side to the side surface 32D side of the substrate 32, it is possible to prevent the cleaning liquid 38 from accumulating on the front and back surfaces 32A and 32B.

In the substrate transfer apparatus 55 too, it is possible to obtain the same advantageous effect as that of the substrate transfer apparatus 10 of the embodiment.

Although a detailed description has so far been given of a preferred embodiment of the invention, the invention is not limited to such a specific embodiment, and various variations and modifications are possible without departing from the scope of the invention described in the claims.

The invention is applicable to a substrate transfer apparatus which can accurately transfer a substrate in a condition in which a pattern forming region is widened.

What is claimed is:
1. A substrate transfer apparatus comprising
pluralities of pairs of substrate support mechanisms,
the substrate support mechanism comprising:
a first roller provided on a first rotary shaft; and
a second roller provided on a second rotary shaft, wherein the substrate support mechanism transfers a substrate in a transfer direction while supporting the substrate between the first and second rollers in a thickness direction of the substrate, wherein the pair of the substrate support mechanisms are disposed so as to oppose to each other in a width direction of the substrate, the pairs of the substrate support mechanisms are arranged along with the transfer direction, and a substrate position regulating member comprising a third roller that regulates a position of the substrate by contacting with a side surface which is parallel to the transfer direction is provided on one of the first and second rotary shafts, wherein the third roller integrally rotates with either the first or second rotary shaft to thereby reduce a load applied to the side surface of the substrate.

2. The substrate transfer apparatus according to claim 1, wherein the substrate position regulating member is at an opposite side of the substrate relative to the first or second roller.

3. The substrate transfer apparatus according to claim 1, wherein a side surface of the first roller at a side of the substrate is substantially flush with an end face of the first rotary shaft, and a side surface of the second roller at a side of the substrate is substantially flush with an end face of the second rotary shaft.

4. The substrate transfer apparatus according to claim 1, wherein the third roller has a larger diameter than the first and second rollers.

5. The substrate transfer apparatus according to claim 4, wherein the third roller comprising a chamfered face at an edge thereof.

6. The substrate transfer apparatus according to claim 1, wherein a rotation direction of the first and second rollers is directed outward with respect to the transfer direction.

7. The substrate transfer apparatus according to claim 1, further comprising a support roller which supports a back surface of the substrate at a vicinity of a center of the substrate.

8. The substrate transfer apparatus according to claim 1, wherein the pair of opposed substrate support mechanisms support and transfer the substrate while inclining the substrate.

* * * * *